(12) United States Patent
Kwak (10) Patent No.: US 7,518,940 B2
(45) Date of Patent: Apr. 14, 2009

(54) CONTROL CIRCUIT FOR STABLE EXIT FROM POWER-DOWN MODE

(75) Inventor: Jong-Tae Kwak, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/521,225

(22) Filed: Sep. 13, 2006

(65) Prior Publication Data

US 2007/0008789 A1 Jan. 11, 2007

Related U.S. Application Data

(62) Division of application No. 10/879,641, filed on Jun. 28, 2004, now Pat. No. 7,130,237.

(30) Foreign Application Priority Data

Dec. 29, 2003 (KR) ...................... 10-2003-0098490

(51) Int. Cl.
*G11C 5/14* (2006.01)
(52) U.S. Cl. ...................... 365/229; 365/226
(58) Field of Classification Search ............ 365/226 X, 365/229 O, 226, 229
See application file for complete search history.

(56) References Cited

U.S. PATENT DOCUMENTS 6,031,782 A * 2/2000 Kobashi et al. ............. 365/228
6,088,290 A * 7/2000 Ohtake et al. ............... 365/233
6,266,294 B1 * 7/2001 Yada et al. .................. 365/233
6,650,594 B1 * 11/2003 Lee et al. .................... 365/233
6,870,416 B2 * 3/2005 Cho ........................... 327/299

FOREIGN PATENT DOCUMENTS

JP    2000-030449    1/2000

* cited by examiner

*Primary Examiner*—VanThu Nguyen
(74) *Attorney, Agent, or Firm*—Blakely, Sokoloff, Taylor & Zafman LLP (57) ABSTRACT

A power-down mode exit control circuit enables a memory device to exit from an initially set power-down mode state using a clock enable signal. Specifically, although a clock enable signal is inputted in an unstable state at an initial operation indicating that a supply of a supply voltage is started, the present invention provides the power-down mode exit control circuit which is capable of escaping from the power-down mode at an internally set correct time. For this, the present invention comprises: a clock enable signal sensor for sensing an activation or deactivation state of a clock enable signal; and a power-down mode exit signal generator for activating and outputting a power-down mode exit signal in accordance with the activation state of the clock enable signal sensed by the sensor, after storing information related to the deactivation state of the clock enable signal sensed by the sensor.

19 Claims, 8 Drawing Sheets

CONTROL CIRCUIT FOR STABLE EXIT FROM POWER-DOWN MODE

The present patent application is a Divisional of application Ser. No. 10/879,641, filed Jun. 28, 2004 now U.S. Pat. No. 7,130,237.

FIELD OF THE INVENTION

The present invention relates to a semiconductor memory device; and, more particularly, to a power-down mode exit control circuit for releasing the memory device from a power-down mode using a clock enable signal.

DESCRIPTION OF RELATED ART

In general, it has been designed that a semiconductor memory device can provide a higher cell capacity and more rapid rate while consuming a lower power. Thus, most semiconductor memory devices have the function of performing a power-down mode that requires a minimum driving current when a data access operation is not carried out.

Conventionally, the memory device maintains the power-down mode when a power is supplied, whereas it is released from the power-down mode if a clock enable signal is applied in an enable state.

The clock enable signal is a signal for interfacing with a chip set of the outside even when the memory device is in a power-down mode, and also a reference signal to decide as to whether a clock signal inputted to the memory device from the chip set of the outside is delivered to a memory core area.

Thus, the memory device conveys the clock signal to the memory core area only if the clock enable signal is in an activation state, but does not convey, if otherwise, i.e., if it is in a deactivation state. In the memory device, therefore, it is possible to perform a data access operation only when the clock signal is transmitted to the memory core area.

Figure 1:
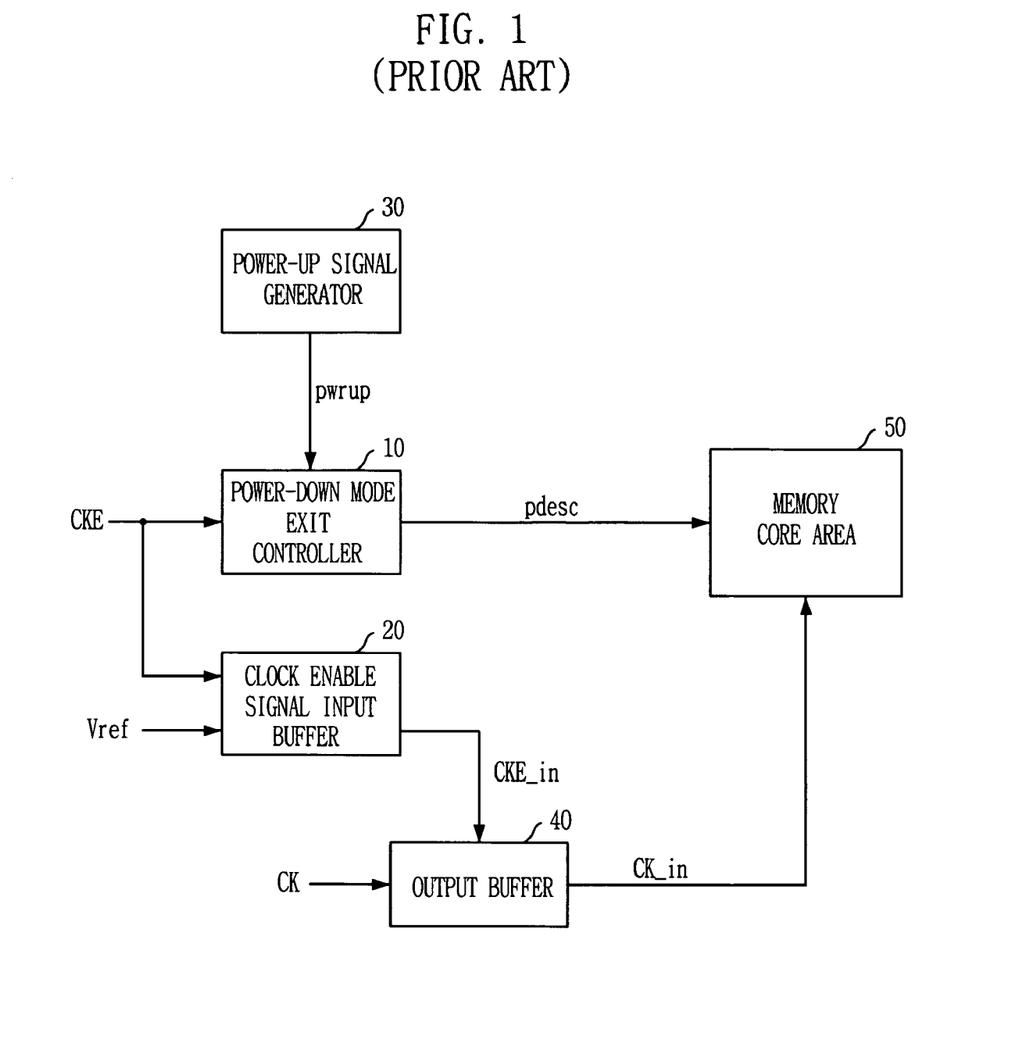
FIG. 1 shows a block configuration diagram of a conventional semiconductor memory device.

FIG. 1 is a block configuration diagram representing a conventional semiconductor memory device.

Referring to FIG. 1, the semiconductor memory device comprises a power-up signal generator 30 for generating and outputting a power-up signal pwrup, a clock enable signal input buffer 20 for comparing a clock enable signal CKE with a reference signal Vref to output a buffered clock enable signal CKE_in, a clock buffer 40, which is enabled relying upon the buffered clock enable signal CKE_in from the clock enable signal input buffer 20, for buffering a clock signal CK to output a buffered clock signal CK_in to a memory core area 50, a power-down mode exit controller 10 for activating and outputting a power-down mode exit signal pdesc in response to a power-up signal pwrup and the clock enable signal CKE, and the memory core area 50 for performing a data access operation in synchronization with the clock signal CK_in buffered after an exit from the power-down mode in response to the power-down mode exit signal pdesc.

As mentioned above, the clock enable signal input buffer 20 inputs the clock enable signal CKE in accordance with the reference signal Vref; and activates and outputs the buffered clock enable signal CKE_in. The clock buffer 40 buffers the clock signal CK and delivers it to the memory core area 50 if the buffered clock enable signal CKE_in is activated.

Figure 2:
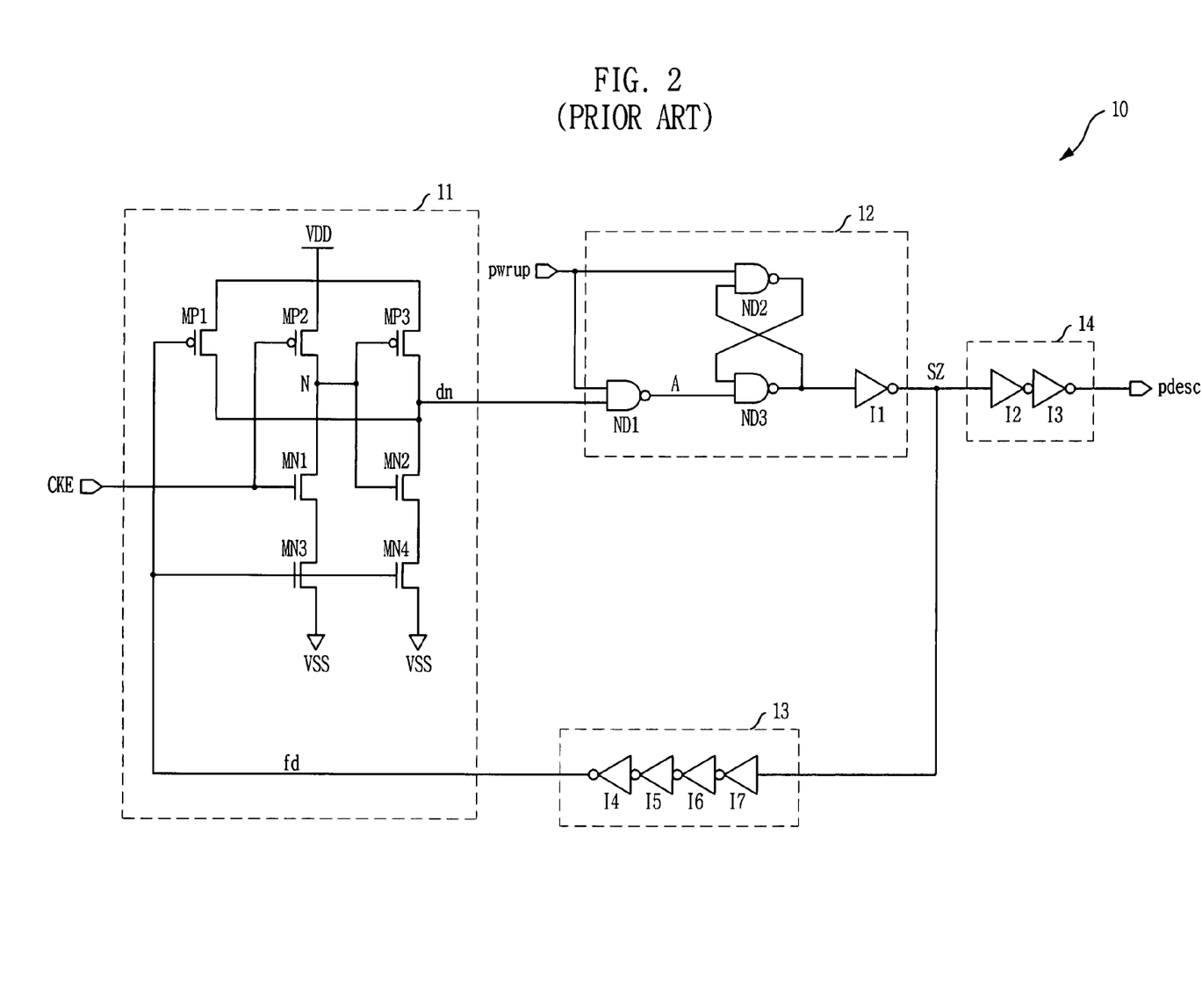
FIG. 2 is a detailed circuit diagram of a power-down mode exit controller according to a prior art.

FIG. 2 presents a detailed circuit diagram of the power-down mode exit controller 10 according to the prior art.

Referring to FIG. 2, the power-down mode exit controller 10 according to the prior art comprises a signal input section 11 for inputting the clock enable signal CKE, a latch section 12 for inputting and latching the output signal dn from the signal input section 11 and the power-up signal pwrup, a first buffer 14 for buffering the output sz from the latch section 12 and outputting the power-down exit signal pdesc, and a second buffer 13 for buffering the output sz from the latch section 12 and outputting a feedback signal fd to deactivate the signal input section 11.

Here, the power-up signal pwrup is a signal outputted from the power-up signal generator 30, and also a signal that is activated and outputted if, when a power is supplied to the memory device, a stable supply voltage of constant level is applied. It is possible for the memory device to perceive that the supply voltage is being inputted to perform a normal operation if the power-up signal pwrup is activated and then generated.

Figure 3:
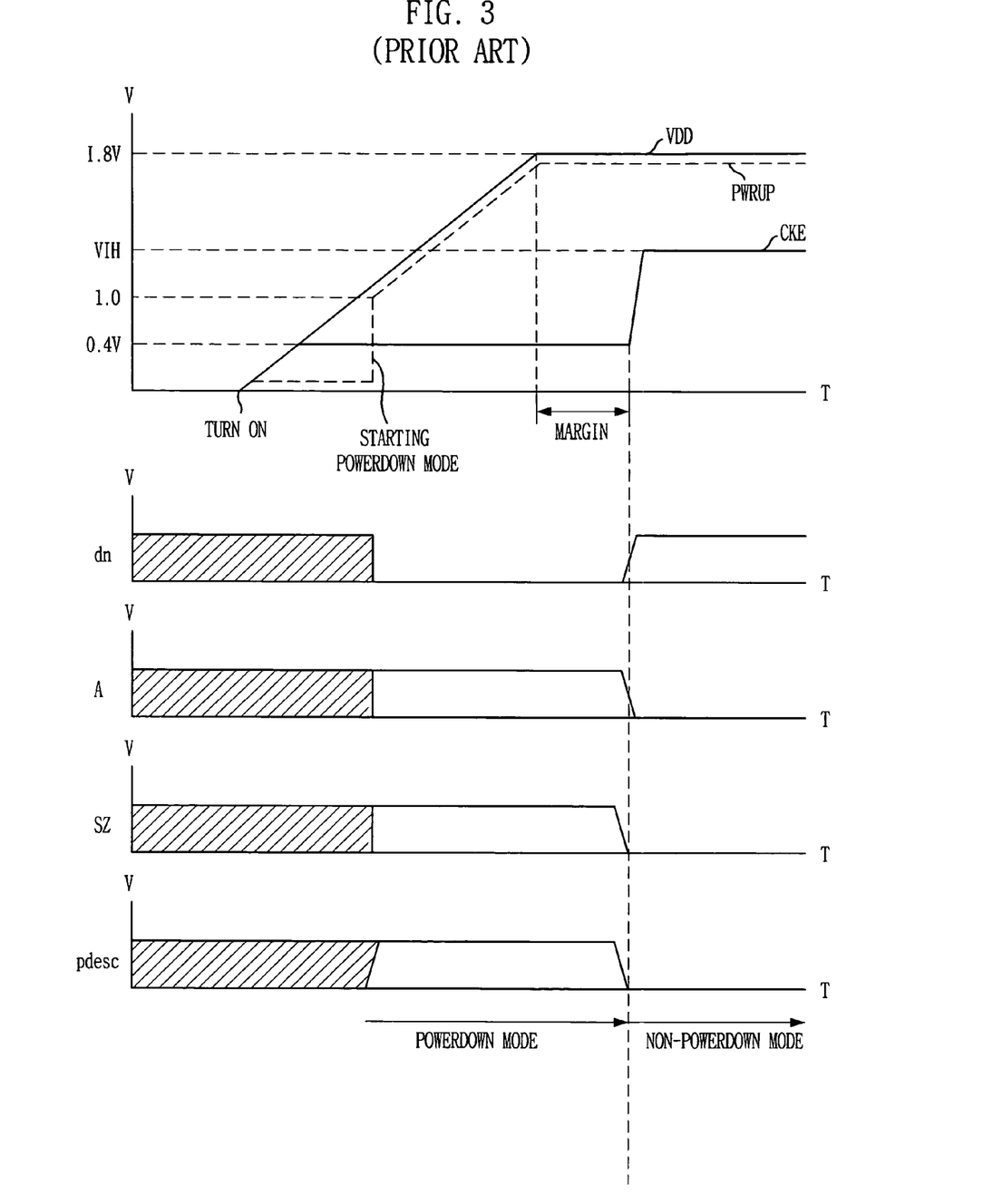
FIG. 3 depicts a waveform diagram showing a normal operation of the power-down mode exit controller shown in FIG. 2.

FIG. 3 provides a waveform diagram showing that the power-down mode exit controller 10 shown in FIG. 2 is normally operated. Hereinafter, an operation of the power-down mode exit controller 10 of the prior art will be described in detail with reference to FIGS. 2 and 3.

The power-down mode exit controller 10 is a circuit used only once in a power-up state, indicating that a supply of a power is started; and inputs the power-up signal pwrup and the clock enable signal CKE, and activates and outputs the power-down mode exit signal pdesc, in order to exit from the power-down mode.

The memory device maintains the power-down mode state at the moment of inputting a power at first and then starts to perform a normal data access operation after a release from the power-down mode if the power-down mode exit signal pdesc is activated in a low level and outputted.

As shown in FIG. 3, at an initial operation of the memory device, if a supply voltage is applied and then arrives at a preset level (e.g., approximately 1.0V), then it activates the power-up signal in a high level and outputs the same. It is noted that the supply voltage resides in a normal state when it arrives at 1.8V. But, to activate and output the power-up signal when reaching 1.0V lower than 1.8V is because driving voltages of desired various levels should be generated and outputted, by advance operations of internal power supply circuit, etc. in the memory device.

Meanwhile, since the clock enable signal CKE in such case is inputted in a deactivation state of low level, the output signal dn of the signal input section 11 would be maintained in a low level. Thus, at a node A, high level is maintained, regardless of a state of the power-up signal pwrup; and also the output of the latch section 12 is high level, allowing the power-down mode exit signal pdesc to be outputted in a deactivate state of high level. Thus, the memory device becomes maintained in a power-down mode during that period.

The above state is maintained for a certain time; and then the clock enable signal CKE is activated in a high level and inputted several tens to several hundreds micro seconds after the supply voltage with driving level of 1.8V is supplied to the memory device.

Accordingly, the output of the signal input section 11 becomes a high level and a state at the node A becomes inverted to a low level. By such a state change, the output of the latch section 12 is inverted to a low level and outputted, making the power-down mode exit signal pdesc activated in a low level and outputted.

From that time, the power-down mode is released and then a normal operation is carried out in the memory device. After that time, the clock enable signal input buffer 20, which is enabled depending on the clock enable signal CKE, is operated and starts to forward the clock signal CK to the memory core area based on a comparison of it and the reference clock Vref.

Table.1 below shows operation at each node of the power-down mode exit controller 10 of the prior art when a normal operation is made as shown in FIG. 3.

TABLE 1

| input state | CKE | pwrup | dn | A | sz | pdsec |
|---|---|---|---|---|---|---|
| initial state | 0 | 0 | 0 | 1 | 1 | 1 |
| activation time of pwrup signal | 0 | 1 | 0 | 1 | 1 | 1 |
| activation time of CKE signal | 1 | 1 | 1 | 0 | 0 | 0 |

As shown in Table.1, it can be seen that, in a normal operation state, the power-down mode exit signal pdesc is activated in a low level and then outputted when the power-up signal pwrup and the clock enable signal CKE are activated.

Figure 4:
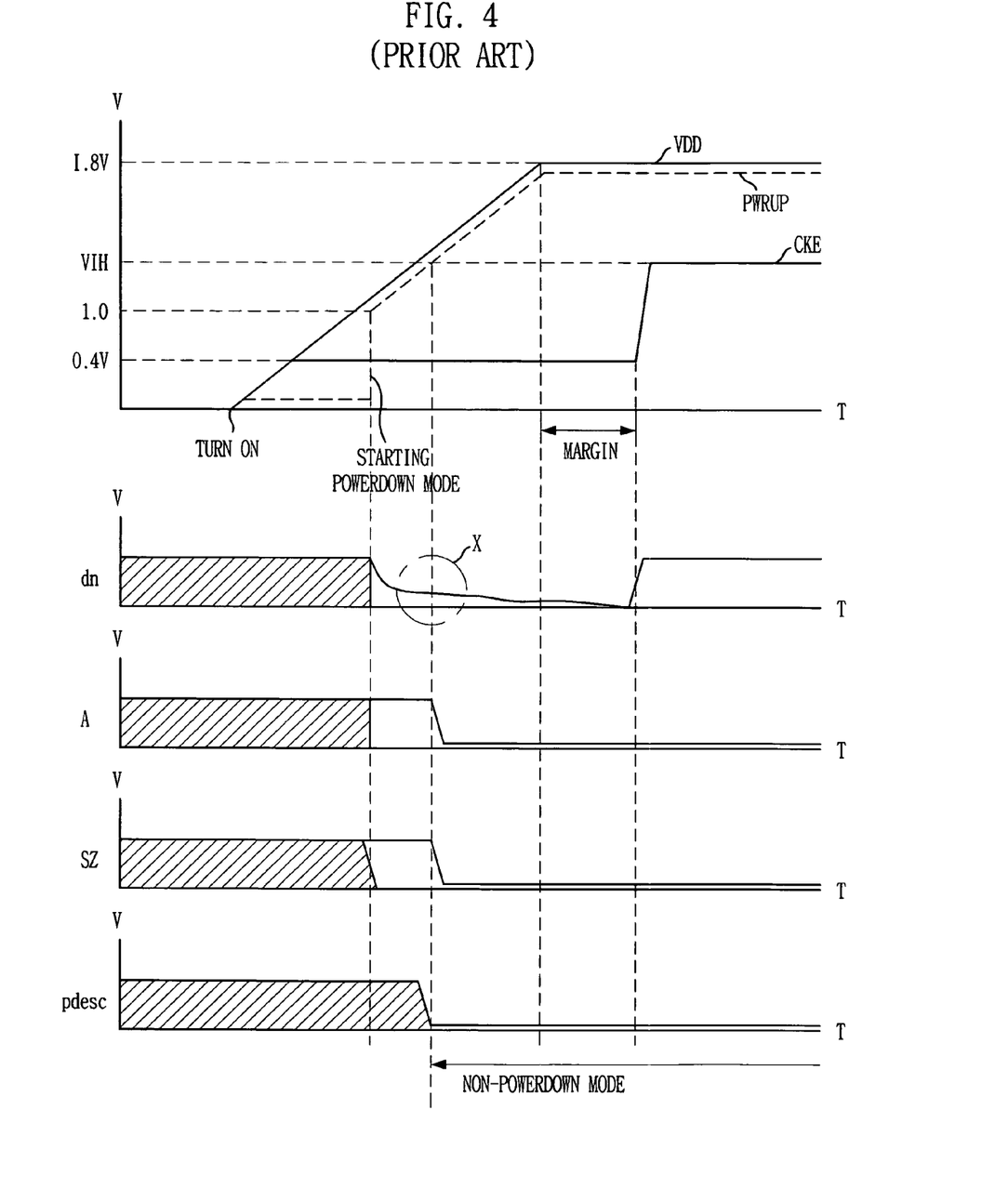
FIG. 4 presents a waveform diagram representing an abnormal operation of the power-down mode exit controller shown in FIG. 2.

FIG. 4 is a waveform diagram representing an abnormal operation state of the power-down mode exit controller shown in FIG. 2. An operational problem of the power-down mode exit controller 10 according to the prior art will be presented with reference to FIGS. 2 and 4 below.

The clock enable signal CKE is a signal that inputs with a voltage level of 0.4V although it is inputted in a disable state of low level.

When a supply voltage is applied to the memory device initially, a voltage at a supply voltage supplying port gradually increases as shown in FIG. 3.

Accordingly, in case that the power-up signal pwrup is activated in a high level, a state of a PMOS transistor MP2 contained in the signal input section 11 is as follows: an input to the gate thereof is the clock enable signal maintaining a disable state of about 0.4V level; and a voltage level at a supply voltage port VDD is 1.0V.

A voltage difference between the source and the gate of the PMOS transistor MP2 becomes about −0.6V. In order for the PMOS transistor MP2 to be turned-on, it is required that the voltage difference between the source and the gate thereof be smaller than a threshold voltage Vth, about −0.7V. For instance, if the voltage difference between the source and the gate thereof is −0.6 V, then the PMOS transistor MP2 may not be turned-on normally.

Thus, at that time (at the moment that the power-up signal pwrup is activated in a high level), if the PMOS transistor MP2 is turned-on unstably, then a voltage level at a node N is unstable, allowing the output signal dn from the input signal section 11 to be unstable but to be maintained in a high level (see X as marked in FIG. 4).

In such a case, if two signals, pwrup and dn, to a NAND gate ND1 of the latch section 12 are all high level, then a voltage level at the node A becomes changed to a low level. If the voltage level at the node A is changed to the low level, the output signal of the latch section 12 becomes changed to a low level, allowing the power-down mode exit signal pdesc to be activated in a low level and outputted.

Although the clock enable signal CKE is not activated and inputted yet, the power-down mode exit signal pdesc is activated in a low level and outputted.

If the power-down mode exit signal pdesc is activated and outputted, the memory device starts to perform a relevant operation to access data by instructions from the outside. However, since, at this time, the supply voltage VDD is not inputted with a complete level, there may be any errors in doing various data accesses. Such errors are ones that may occur under special circumstances that the supply voltage is applied initially.

Table.2 below represents operation state at each node when the power-down mode exit controller 10 of the prior art makes the power-down mode exit signal activated in a low level and outputted, prior to a preset time by errors, as shown in FIG. 4.

TABLE 2

| input state | CKE | pwrup | dn | A | sz | pdsec |
|---|---|---|---|---|---|---|
| initial state | 0 | 0 | 1 (error) | 1 | 1 | 1 |
| activation time of pwrup signal | 0 | 1 | 1 (error) | 0 (error) | 0 (error) | 0 (error) |
| activation time of CKE signal | 1 | 1 | 1 | 0 | 0 | 0 |

As shown in Table.2 above, it can be seen that, due to the clock enable signal CKE which is a low level when a supply voltage is supplied but is inputted with a constant voltage, the output signal dn of the signal input section 11 is maintained in erroneous state of high level and then the power-down mode exit signal pdesc becomes activated at the moment that the power-down mode is activated, i.e., before a preset time. In Table.2, the indication "error" represents a malfunction state.

As a technology of the memory device has been developed, a level of driving voltage used therein tends to lower further. Thus, if the power-down mode exit controller 10 of the prior art is applied to a low voltage memory device that utilizes a driving voltage lower than 1.8V, a sense voltage level of the power-up signal pwrup becomes lower more.

In such a case, the PMOS transistor MP2 of the signal input section 11 is turned-on more unstably; and thus, the output signal therefrom may be high level by error although the clock enable signal is inputted in a disable state of low level. Due to such reasons, the power-down exit signal pdesc may be activated in a low level before a preset time and then outputted.

Accordingly, using the prior art power-down mode exit controller continuously may result in more many errors as the driving voltage lowers.

SUMMARY OF THE INVENTION

It is, therefore, an object of the present invention to provide a power-down mode exit control circuit which enables a memory device to exit from the power-down mode at an internally set correct time although a clock enable signal is inputted in an unstable state at an initial operation that a supply of a supply voltage is started.

An another object of the present invention is to provide a power-down mode exit control circuit which enables a memory device to exit from the power-down mode at an internally set correct time although the memory device is derived by a lower voltage in case that a clock enable signal is inputted to the memory device in an unstable state at an initial operation indicating that a supply of a supply voltage is started.

In accordance with one aspect of the present invention, there is provided a power-down mode exit control circuit, comprising: a clock enable signal sensing means for sensing whether a clock enable signal is in an activation or deactivation state; and a power-down mode exit signal generator for storing information related to the deactivation state of the clock enable signal sensed by said clock enable signal sensing means, and then activating and outputting a power-down mode exit signal in accordance with the activation state of the clock enable signal sensed by said sensing means.

In accordance with another aspect of the present invention, there is provided a driving method of a memory device for escaping from a power-down mode in response to a power-up signal and a clock enable signal at an initial setting starting a supply of supply voltage, comprising the steps of: setting a power-down mode when the supply voltage is supplied; sensing the power-up signal being activated when the supply voltage increases by a preset level; maintaining the power-down mode by sensing a deactivation of the clock enable signal when the supply voltage reaches the preset level; and escaping from the power-down mode in response to the activated power-up signal and the clock enable signal that is activated and inputted.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a preferred embodiment of the present invention will be described with reference to the accompanying drawings, to explain in detail in such a manner that the technical spirit of the invention can be easily conceived by those skilled in the art.

Figure 5:
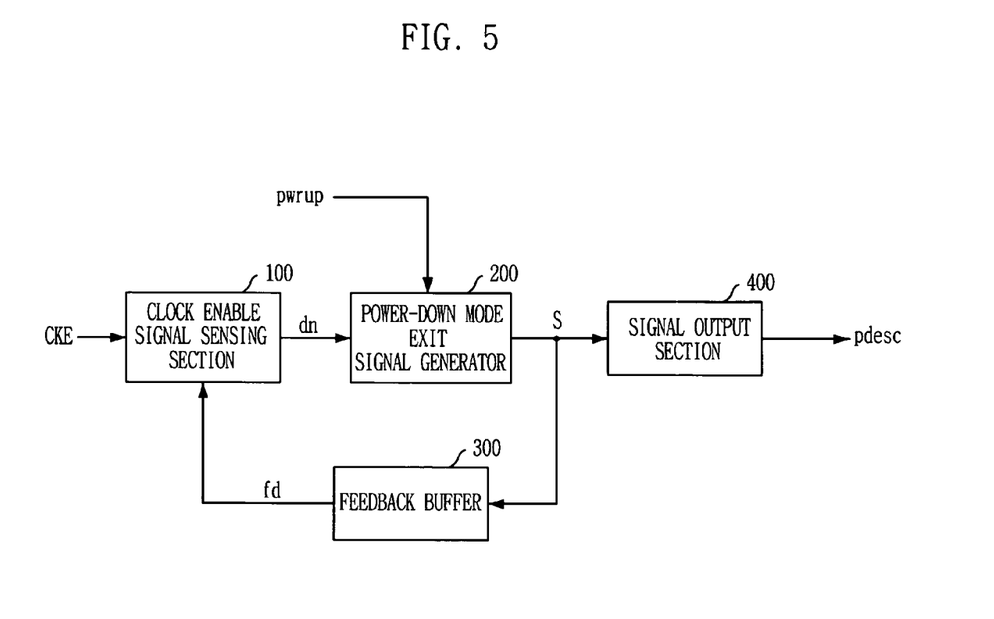
FIG. 5 offers a block diagram of a power-down mode exit controller in accordance with a preferred embodiment of the present invention.

FIG. 5 shows a block diagram of a power-down mode exit control circuit in accordance with a preferred embodiment of the present invention.

Referring to FIG. 5, the power-down mode exit control circuit of the present invention comprises a clock enable signal sensing section 100 for sensing whether a clock enable signal CKE is in an activation state or deactivation state and outputting the sensed result, and a power-down mode exit signal generator 200 for storing the clock enable signal CKE of deactivation state, activating an output signal S when it is sensed by the sensing section 100 that the clock enable signal CKE is in the activation state, and outputting it.

Here, the power-down mode exit signal generator 200 activates and outputs the output signal S, in response to the activation state of the clock enable signal CKE and an activated power-up signal pwrup.

Further, the power-down mode exit control circuit of the present invention further comprises a signal output section 400 for inverting the output S from the power-down mode exit signal generator 200 and outputting the inverted one as a power-down mode exit signal pdesc.

Also, the power-down mode exit control circuit of the present invention further comprises a feedback signal output section 300 for activating and outputting a feedback signal fd in response to the output signal activated from the power-down mode exit signal generator 200, wherein it is designed that the clock enable signal sensing section 100 is disabled in response to the activated feedback signal fd.

Figure 6:
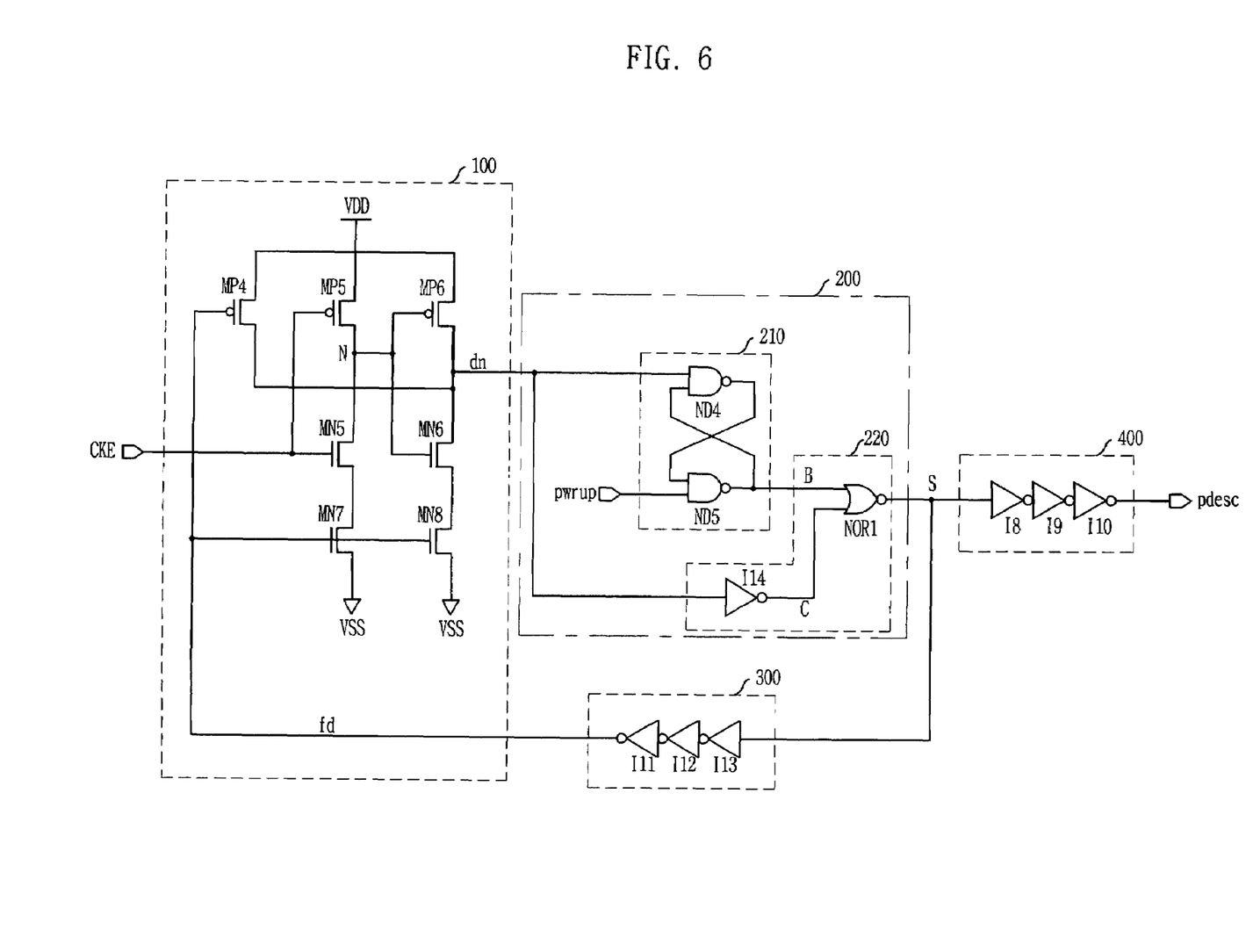
FIG. 6 presents a detailed circuit diagram of the power-down mode exit controller shown in FIG. 5.

FIG. 6 provides a detailed circuit diagram of the power-down mode exit control circuit shown in FIG. 5.

Referring to FIG. 6, the power-down mode signal generator 200 comprises a latch section 210 for latching the output signal dn from the clock enable signal sensor 100, and activating and outputting the output signal dn with low level in response to a power-up signal pwrup that is activated in a high level, and a signal combination section 220 for combining the output from the latch section 210 that is activated and outputted in low level with the output signal dn that is activated and outputted in high level at the clock enable signal sensor 100, and activating and outputting an output signal S in a high level.

The latch section 210 includes two NAND gates ND4 and ND5 whose first input ports receives the output signal dn and power-up signal pwrup from the clock enable signal sensing section 100, respectively, and second input ports receive outputs from the first input ports in a cross-coupled fashion, respectively.

The signal combination section 220 includes an inverter 114 for inverting and outputting the output from the clock enable signal sensing section 100, and a NOR gate NOR1 for inputting the output from the NAND gate ND5 and the output from the inverter 114.

The clock enable signal sensing section 100 comprises a first signal inverting section 120 which is enabled in response to a feedback signal fd that is deactivated in high level for inverting and outputting the clock enable signal CKE, a second signal inverting section 130 which is enabled in response to the feedback signal fd which is deactivated in high level for inverting the output from the first signal inverting section 120 and outputting it to the power-down mode exit signal generator 200, and a signal transferring section 110 which is turned-on in response to the feedback signal fd activated in low level for allowing the output signal dn of high level (i.e., a signal corresponding to the clock enable signal CKE that is enabled in high level) to be transferred to the power-down mode exit signal generator 200, regardless of input state of the clock enable signal CKE.

The first signal inverting section 120 comprises a PMOS transistor MP5 whose gate inputs the clock enable signal CKE and one port is coupled to the supply voltage VDD, a NMOS transistor MN5 whose gate inputs the clock enable signal CKE and one port is coupled to the other port of the PMOS transistor MP5, and a NMOS transistor MN7, whose gate inputs the feedback signal fd, coupled between the other port of the NMOS transistor MN5 and the grounding voltage VSS.

The second signal inverting section 130 comprises a PMOS transistor MP6 whose gate inputs the clock enable signal CKE and one port is coupled to the supply voltage VDD, a NMOS transistor MN6 whose gate inputs the clock enable signal CKE and one port is coupled to the other port of the PMOS transistor MP6, and a NMOS transistor MN4, whose gate inputs the feedback signal fd, connected between the other port of the NMOS transistor MN6 and the grounding voltage VSS.

The signal transferring section 110 includes a PMOS transistor MP4 that inputs the feedback signal fd through the gate and outputs a signal of high level to the power-down mode exit signal generator 200.

Figure 7:
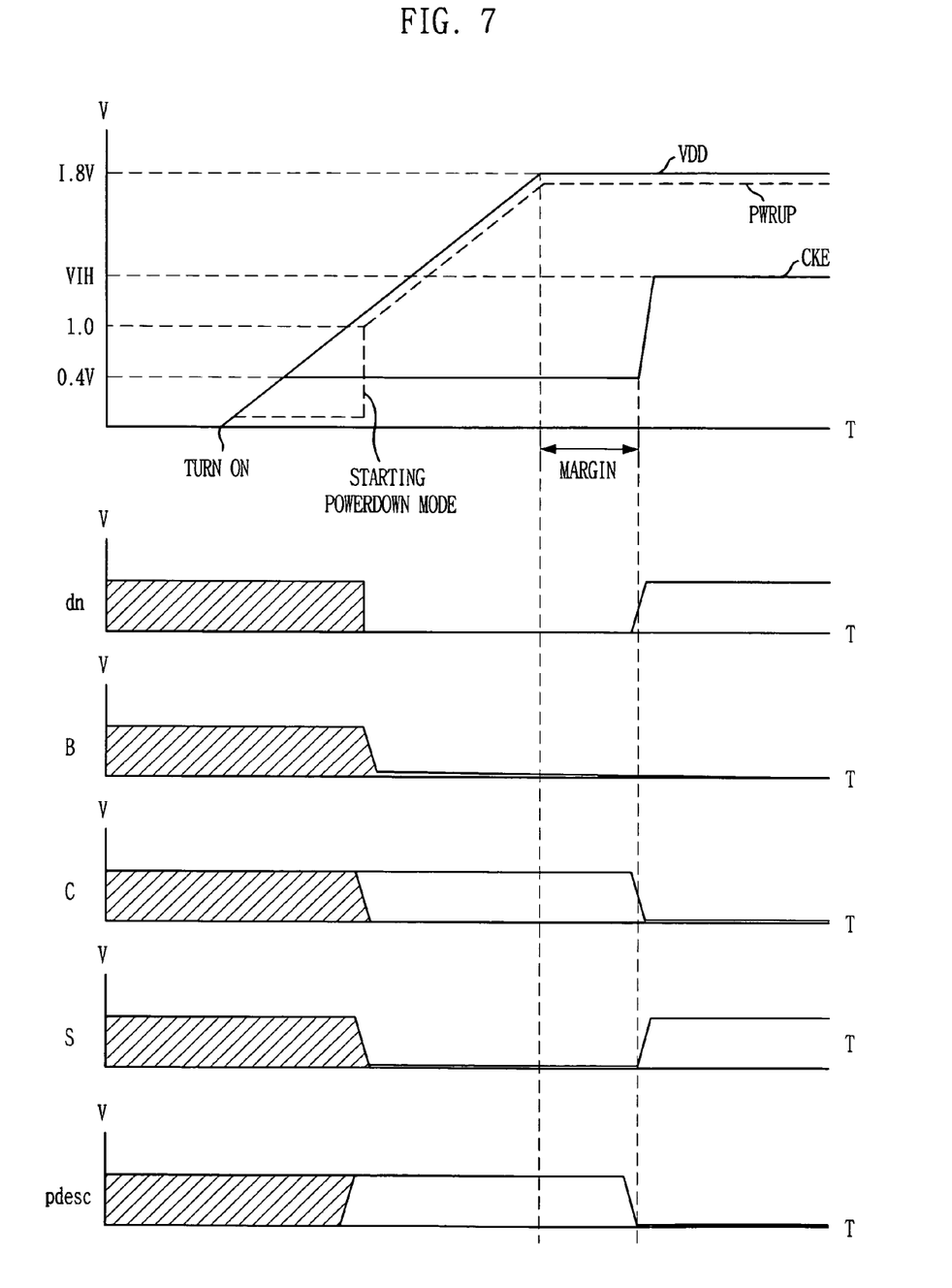
FIG. 7 is a waveform diagram showing the operation in case that the power-down mode exit controller shown in FIG. 5 normally senses a clock enable signal.

FIG. 7 is a waveform diagram showing the operation in case that the power-down mode exit control circuit as shown in FIG. 5 normally senses the clock enable signal CKE. First of all, an operation of normally sensing the clock enable signal CKE will be described in detail with reference to FIG. 7.

As shown in FIG. 7, at an initial operation of the memory device, if it is sensed that the supply voltage is applied and arrives at a prescribed level (here, approximately 1.0V), the power-up signal pwrup of high level is activated and outputted.

To activate and output the power-up signal pwrup in a high level when the supply voltage arrives at 1.0V lower than the prescribed level 1.8V is because internal power supply circuit, etc. in the memory device generates driving voltages of various levels in advance, as mentioned above.

At that time, the clock enable signal CKE is inputted in a deactivation state of low level; and if the clock enable signal sensing section 100 normally senses the above state, the output signal dn of low level is deactivated and outputted, making high level at a node C maintained.

Thus, after the power-up signal pwrup is activated in high level and inputted, a low level is maintained at a node B of the latch section 210.

After that, if the clock enable signal CKE is activated in high level and inputted, the output signal dn of the clock enable signal sensing section 100 becomes high level and the node C becomes low level. Accordingly, the output of the signal combination section 220 is activated in high level and outputted; and then it is inverted by the signal output section 400, to output the power-down mode exit signal pdesc that is activated in low level. After that time, the power-down mode is released and the memory device performs a normal operation.

In the meantime, if the output signal S from the power-down mode exit signal generator 200 is activated in high level and outputted, the feedback signal output section 300 inverters the output signal and outputs the feedback signal fd that is activated in low level.

The clock enable signal sensing section 100 outputs the output signal dn of high level by allowing the PMOS transistor MP4 of the signal transferring section 110 to be turned-on by the feedback signal fd. Further, NMOS transistors MN7 and MN8 of the first and second signal inverting sections 120 and 130 are turned-off in response to the feedback signal fd; and thus, no sensing operation on the clock enable signal CKE is carried out.

Since the power-down mode exit control circuit is operated once at first when the supply voltage is applied to the memory device, it should be noted that the clock enable signal sensing section is maintained in disable state, in order to make it not operated after the clock enable signal is enabled.

Table.3 below shows operation at each node in the power-down mode exit controller 10 when the normal operation is made as shown in FIG. 7.

TABLE 3

| input state | CKE | dn | pwrup | B | C | S | pdesc |
|---|---|---|---|---|---|---|---|
| initial state | 0 | 0 | 0 | 1 | 1 | 0 | 1 |
| activation time of pwrup signal | 0 | 0 | 1 | 0 | 1 | 0 | 1 |
| activation time of CKE signal | 1 | 1 | 1 | 0 | 0 | 1 | 0 |

As shown is Table.3, it can be seen that, by sensing the clock enable signal CKE precisely by the clock enable signal sensing section 100, the power-down mode exit signal pdesc is activated in low level and outputted, at the moment that the clock enable signal CKE is activated in high level.

Figure 8:
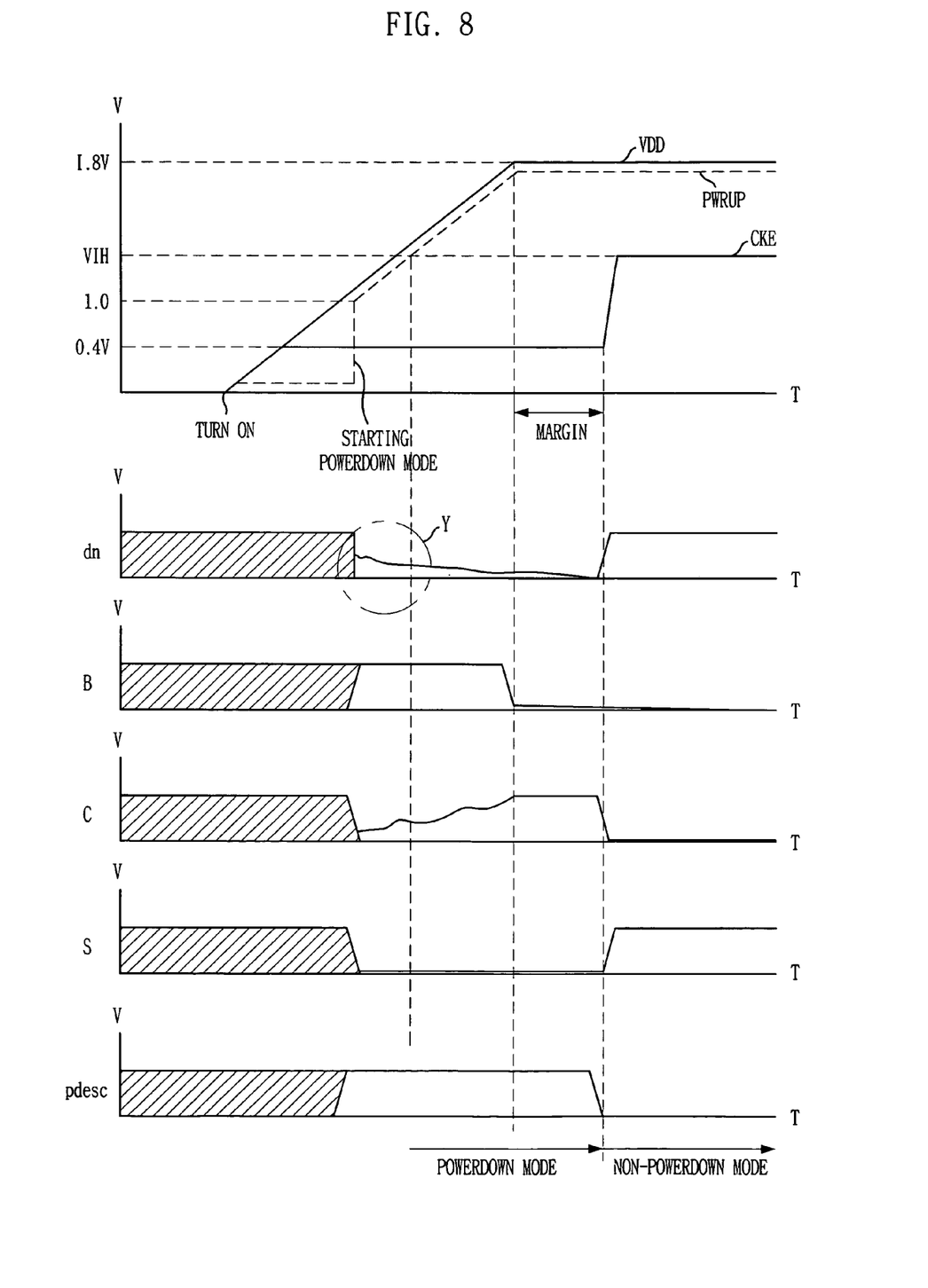
FIG. 8 provides a waveform diagram showing the operation in case that the power-down mode exit controller shown in FIG. 5 abnormally senses a clock enable signal.

FIG. 8 is a waveform diagram showing the operation in case that the power-down mode exit control circuit as shown in FIG. 5 does not senses the clock enable signal CKE normally.

Continuously, when the clock enable signal sensing section 100 does not senses the clock enable signal CKE normally, details of the power-down mode exit control circuit in accordance with the present invention will be provided with reference to FIG. 8.

The clock enable signal CKE that is inputted in low level when the supply voltage starts to apply to the memory device may be a voltage level of approximately 0.4V based on a preset specification. When a level of the supply voltage gradually increases and reaches a prescribed level (approximately 1.0V), the power-up signal pwrup is activated in high level and inputted.

As described in the prior art, at that time, a voltage between the gate and source (supply voltage) of the PMOS transistor MP5 in the clock enable signal sensing section 100 is higher than a threshold voltage (−0.7V); and thus, the transistor may not be turned-on normally. Due to such reason, although the clock enable signal CKE is inputted in a deactivation state of low level, the output signal dn of the clock enable signal sensing section 100 may be an erroneous activated state of high level (see Y as marked in FIG. 8).

Although the output signal dn of the clock enable signal sensing section 100 may be an erroneous high level, the output of the latch section 210 in the power-down mode exit signal generator 200 is maintained in high state as in the previous state.

At an initial time, since the power-up signal pwrup is low level, the output of the NAND gate ND4 becomes high level. At this state, if the output signal dn of the clock enable signal sensing section 100 is inputted in high level, and the power-up signal pwrup is activated in high level and inputted, then the output of the NAND gate ND4 is low level, and the output of the NAND gate ND5 and output B of the latch section 210 are maintained in high level.

For instance, if the output B of the latch section 210 is maintained in high level, the output of the NOR gate NOR1 in the signal combination section 220 is maintained in low level, allowing the power mode exit signal pdesc to be maintained in a deactivation state of high level.

Explaining continuously, if the supply voltage VDD is inputted in a preset level, the PMOS transistor MP5 in the clock enable signal sensing section 100 is turned-on completely and then the output signal dn becomes a complete low level.

By this reason, the output of the NAND gate ND4 in the latch section 210 becomes high level and the output of the NAND gate ND5 becomes low level. On the other hand, the output of the inverter 114 in the signal combination section 220 becomes high level and the output of the NOR gate NOR1 becomes still maintained in a deactivation state of high level.

Thereafter, if the clock enable signal CKE is activated in high level and inputted, the output signal dn of the clock enable signal sensing section 100 becomes high level. Thus, the output of the inverter 114 becomes low level and the output of the NOR gate NOR1 becomes activated in high level and outputted when the output B of the latch section 210 is maintained in low level. Due to such reason, the power-down mode exit signal pdesc is activated in low level and outputted.

The power-up mode exit signal generator 200 in accordance with the invention first senses that the output signal dn from the clock enable signal sensing section 100 is outputted in a deactivation state of low level and then stores it. After that, the output signal S is activated and outputted in response to the activated output signal dn.

That is to say, when the clock enable signal sensing section 100 totally senses and outputs the clock enable signal of low level without error by a supply of the supply voltage of a level above a preset level, the power-up mode exit signal generator 200 stores it.

In the meantime, the feedback signal generator 300 inputs the output signal dn with power-down high level from the mode signal generator 200 and outputs feedback signal activated with low level. The clock enable signal sensing section 100 maintains the disable state by the feedback signal fd.

Table.4 below shows the operation in case that the power-down mode exit control circuit as shown in FIG. 5 normally does not sense the clock enable signal CKE.

TABLE 3

| Input state | CKE | dn | pwrup | B | C | S | pdsec |
| --- | --- | --- | --- | --- | --- | --- | --- |
| initial state | 0 | 1 (error) | 0 | 1 | 0 | 0 | 1 |
| activation time of pwrup signal | 0 | 1 (error) | 1 | 1 | 0 | 0 | 1 |
| completion of input of supply voltage | 0 | 0 | 1 | 0 | 1 | 0 | 1 |
| activation time of CKE signal | 1 | 1 | 1 | 0 | 0 | 1 | 0 |

As shown in Table.4, it can be seen that the power-down mode exit signal pdesc is activated at a normal timing although there is any error upon sensing the clock enable signal CKE in the clock enable signal sensing section 100.

As can be seen from the above, although the clock enable signal that is inputted in a deactivation state is erroneously sensed internally under special circumstance that the supply voltage is supplied to the memory device by the power-down mode exit control circuit of the present invention, it is possible to remove the state that the power-down mode is exited at an abnormal timing and the memory device starts to operate under the circumstance that a stable setting is not made.

Further, there is illustrated the above-mentioned memory device that is operated by 1.8V, and the power-down mode exit control circuit of the invention controls to enable the memory device to exit from the power-down mode at a stable timing although the memory device is operated by a lower voltage.

If the driving voltage becomes smaller than 1.8V, a voltage level at which the power-up signal is activated will be outputted at a lower level than 1.0V. Thus, there may be more easily occurred errors upon sensing the clock enable signal CKE of a deactivation state of low level in the clock enable signal sensing circuit (it is further difficult that the PMOS transistor MP5 of the clock enable signal sensor 100 normally turns-on.

In such a case, the power-down mode signal generator 200 included in the power-down mode exit circuit of the invention first stores the output signal dn of low level that is outputted by normally sensing the clock enable signal CKE of low level in the clock enable signal sensing section 100 if the supply voltage is larger than a preset level. After that, it is composed that the generator 200 is operated in response to the activation of the activated clock enable signal. As a result, there may not be occurred an error to exit from the power-down mode before the preset time.

Accordingly, although the semiconductor memory device is activated by a lower voltage, the power-down mode exit circuit of the present invention enables the memory device to exit from the power-down mode at a preset correct timing upon an initial setting operation.

In accordance with the present invention, since the memory device having the power-down mode exit controller of present invention can be operated always at a normal timing under an initial operation that a supply of a supply voltage is started, it can be expected that the reliability for operation of the memory device can be very improved.

Furthermore, the memory device having the power-down mode exit controller of present invention can be made to allow the power-down mode to be released at a precisely preset time although it is operated by a lower voltage at an initial operation. Thus, with the present invention, it is possible to develop more easily the memory device of a low voltage that is capable of stably operating.

The present application contains subject matter related to Korean patent application No. 2003-98490, filed in the Korean Patent Office on Dec. 29, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A driving method of a memory device for escaping from a power-down mode in response to a power-up signal and a clock enable signal at an initial setting starting a supply of supply voltage, comprising:
   setting the power-down mode at the initial setting starting the supply of the supply voltage;
   latching a inactivated state of the clock enable signal in response to the power-up signal which is used a reset signal of a latch;
   combining a activated state of the clock enable signal and a previously latched state of the clock enable signal when the clock enable signal is activated;
   outputting a power-down mode exit signal in response to the combined result of the previously latched state of the clock enable signal and the current activated state of the clock enable signal;
   escaping from the power-down mode in response to the power-down mode exit signal; and
   interrupting in input of the clock enable signal when the memory device escapes from the power-down mode.

2. The driving method of a memory device as recited in claim 1, further comprising:
   sensing whether the clock enable signal is in an activation or deactivation state.

3. An apparatus for preventing malfunctions at an initial operation, comprising:

a device for determining an operation state according to a level of a power voltage; and a controller for combining a current state of the device and the previous state of the device, and selecting one of the maintaining the previous state from a timing of starting to supply the power voltage to a timing of supplying a full level of the power voltage in response to the combined result, and the escaping the previous state in response to a power-down mode exit signal, wherein the controller includes:

signal combination unit for combining the previous state and a current state of the device, to thereby output as the power-down mode exit signal in response to the combined result.

4. The apparatus as recited in claim 3, wherein the controller includes a latch for storing the previous state.

5. The apparatus as recited in claim 3, wherein the controller sets the operation state of the device as the power-down mode at the timing of starting to supply the power voltage, and escapes from the power-down mode in response to a power-up signal and a clock enable signal.

6. The apparatus as recited in claim 3, wherein the timing of starting to supply the power voltage is determined by the power-up signal which is activated when the power voltage reaches a predetermined voltage level.

7. The apparatus as recited in claim 6, wherein the clock enable signal is enabled after the timing of supplying the full level of the power voltage.

8. The apparatus as recited in claim 7, wherein the controller includes:

a clock enable signal sensing unit for sensing whether the clock enable signal is in an activation or deactivation state; and a power-down mode controller for latching the sensed state of the clock enable signal when the power-up signal is activated, combining a currently sensed state and the previously latched state of the clock enable signal, and maintaining the power-down mode in response to the combined result.

9. The apparatus as recited in claim 8, wherein the power-down mode controller generates a power-down mode exit signal which is disabled during the power-down mode.

10. The apparatus as recited in claim 9, wherein the power-down mode controller includes:

a latch unit for latching the sensed state of the clock enable signal.

11. The apparatus as recited in claim 10, wherein the latch unit includes first and second NAND gates whose first input ports receive the sensed state of the clock enable signal and the power-up signal, respectively, and second input ports receive output signals of the first and second NAND gates in a cross-coupled fashion, respectively.

12. The apparatus as recited in claim 11, wherein the signal combination unit includes:

an inverter for inverting the current sensed state of the clock enable signal; and a logic gate for performing an NOR operation of the output signal of the second NAND gate and an output signal of the inverter.

13. The apparatus as recited in claim 10, further comprising a buffer for buffering and outputting an output signal of the power-down mode controller as the power-down mode exit signal.

14. The apparatus as recited in claim 10, further comprising a feedback unit for activating and outputting a feedback signal in response to the power-down mode exit signal, wherein the clock enable signal sensing unit is disabled in response to the feedback signal that is enabled.

15. The apparatus as recited in claim 14, wherein the clock signal sensing unit includes:

a first signal inverting unit for inverting the clock enable signal in response to the feedback signal;

a second signal inverting unit for inverting an output of the first signal inverting unit to output the inverted signal to the power-down mode controller in response to the feedback signal; and a signal transferring unit for outputting a signal corresponding to an activation state of the clock enable signal to the power-down mode controller in response to the feedback signal, regardless of the input state of the clock enable signal.

16. The apparatus as recited in claim 15, wherein the first inverting unit includes:

a PMOS transistor whose gate receives the clock enable signal and one port is coupled to a first supply voltage;

a first NMOS transistor whose gate receives the clock enable signal and one port is coupled to the other port of the PMOS transistor; and a second NMOS transistor whose gate receives the feedback signal, connected between the other port of the first NMOS transistor and a second supply voltage.

17. The apparatus as recited in claim 15, wherein the second signal inverting unit includes:

a PMOS transistor whose gate receives the output of the first signal inverting unit and one port is coupled to a first supply voltage;

a first NMOS transistor whose gate receives the output of the first signal inverting unit and one port is coupled to the other port of the PMOS transistor; and a second NMOS transistor whose gate receives the feedback signal, connected between the other port of the first NMOS transistor and a second supply voltage.

18. The apparatus as recited in claim 15, wherein the signal transferring unit includes a PMOS transistor, whose gate receives the feedback signal, for outputting the signal corresponding to the activation state of the clock enable signal to the power-mode controller regardless of the input state of the clock enable signal.

19. The driving method of a memory device as recited in claim 1, further comprise buffering the power-down mode exit signal.

* * * * *